United States Patent
Huckerby et al.

(10) Patent No.: US 10,546,071 B2
(45) Date of Patent: Jan. 28, 2020

(54) MULTI COORDINATE REFERENCE SYSTEM FOR POSITIONING BLADED DRUM

(71) Applicant: ROLLS-ROYCE plc, London (GB)

(72) Inventors: Karl Huckerby, Derby (GB); Eoin Stock, Derby (GB)

(73) Assignee: ROLLS-ROYCE plc, London (GB)

( * ) Notice: Subject to any disclaimer, the term of this patent is extended or adjusted under 35 U.S.C. 154(b) by 766 days.

(21) Appl. No.: 15/072,507

(22) Filed: Mar. 17, 2016

(65) Prior Publication Data

US 2016/0292308 A1    Oct. 6, 2016

(30) Foreign Application Priority Data

Mar. 30, 2015   (GB) .................................. 1505400.0

(51) Int. Cl.
*G06F 17/50*    (2006.01)
*F01D 5/00*    (2006.01)
(Continued)

(52) U.S. Cl.
CPC ............. *G06F 17/50* (2013.01); *F01D 5/005* (2013.01); *F01D 5/34* (2013.01); *F01D 21/003* (2013.01); *F04D 19/02* (2013.01); *F04D 27/001* (2013.01); *F04D 29/321* (2013.01); *G01B 5/0004* (2013.01); *G01B 5/25* (2013.01); *G01B 11/272* (2013.01); *F05D 2220/32* (2013.01);
(Continued)

(58) Field of Classification Search
CPC . G06F 17/50; F01D 5/005; F01D 5/34; F04D 19/02; F04D 27/001; F04D 29/321; G01B 5/004; G01B 5/25; G01B 11/272

USPC .............................................................. 703/1
See application file for complete search history.

(56) References Cited

U.S. PATENT DOCUMENTS 6,748,112 B1 * 6/2004 Nguyen ................ F01D 21/003
348/92
2005/0171733 A1   8/2005 Hough
(Continued)

FOREIGN PATENT DOCUMENTS

DE    102005054808 A1    5/2007

OTHER PUBLICATIONS

Nov. 3, 2016 Search Report issued in European Patent Application No. 16160580.
(Continued)

*Primary Examiner* — Andre Pierre Louis
(74) *Attorney, Agent, or Firm* — Oliff PLC (57) ABSTRACT

A method provides for measuring an assembled component including two or more parts, the method including the steps of: providing the component with a plurality of unique markers for detection during a scanning process; defining a first of the unique markers and aligning the first defined unique marker with a first element of the component; defining a second of the unique markers and aligning the second defined unique marker with a second element of the component; scanning the component and unique markers to capture a digitised version of the component and the relative positions of the first and second defined unique markers; and aligning a nominal CAD model of a part of the component with the equivalent part of the digitised version of the component using the relative positions of the first and second defined unique markers.

14 Claims, 6 Drawing Sheets

(51) Int. Cl.
| | |
|---|---|
| *F01D 5/34* | (2006.01) |
| *F04D 29/32* | (2006.01) |
| *F04D 27/00* | (2006.01) |
| *F04D 19/02* | (2006.01) |
| *G01B 5/25* | (2006.01) |
| *F01D 21/00* | (2006.01) |
| *G01B 11/27* | (2006.01) |
| *G01B 5/00* | (2006.01) |

(52) U.S. Cl.
CPC ...... *F05D 2230/72* (2013.01); *F05D 2230/80* (2013.01); *F05D 2260/80* (2013.01); *F05D 2260/83* (2013.01); *Y02T 50/673* (2013.01)

(56) References Cited

U.S. PATENT DOCUMENTS

| | | | |
|---|---|---|---|
| 2011/0027091 A1* | 2/2011 | Clemen | F04D 29/324 416/219 R |
| 2011/0183289 A1* | 7/2011 | Powell | A61C 8/00 433/173 |
| 2012/0130528 A1 | 5/2012 | Stark et al. | |
| 2013/0326876 A1* | 12/2013 | Weiss | B23K 35/004 29/888.021 |
| 2013/0340521 A1 | 12/2013 | Clark et al. | |
| 2016/0287395 A1* | 10/2016 | Khalili | A61F 2/30942 |

OTHER PUBLICATIONS

Sep. 25, 2015 Search Report issued in British Patent Application No. 1505400.0.

* cited by examiner

MULTI COORDINATE REFERENCE SYSTEM FOR POSITIONING BLADED DRUM

BACKGROUND OF THE INVENTION

The present invention relates to a method and system for measuring an article formed from two or more parts, in particular to a method of measuring a component comprising two or more parts arranged along a centre line or axis, such as a multi-stage bladed drum from a gas turbine.

Bladed discs, single components incorporating both a rotor disc and blades, have become popular in turbomachinery, and particularly in the aerospace industry. By incorporating the blades and the supporting disc or ring in a single component, weight savings that can be achieved over more conventional arrangements where individual blades are mechanically fixed to a disc at their roots.

Two or more bladed discs can be joined together to form multi-stage compressor drums for use within a turbine or engine, each bladed disc providing the blades for one stage Damage can occur to turbine blades during operation, and operational temperatures and loads are so high that blades can also become stretched without any external influence. To ensure reliable operation, regular servicing of turbines is important. One drawback of bladed discs is that servicing becomes more complicated. More conventional designs allow for the replacement of one or more individual blades within the assembly as required, but the unitary nature of bladed discs removes this option. Instead, to avoid disposing of an entire bladed disc or even an entire bladed drum when a single blade is damaged, adaptive machining is used to repair or grind down and replace damaged or faulty blades. This requires inspection of the component and comparison with an ideal model.

Inspection, adaptive machining and repair of components can be achieved by a number of techniques. Since the advent of Computer Aided Design (CAD) one technique has been to compare measured details of an actual article with a nominal CAD model of the same article and use software to determine differences between the two and, in some cases, provide instructions to automated tools for the adaptive machining or repair process.

In order to achieve comparisons of this type it is necessary to generate an accurate three dimensional model of the article in question and then precisely align the generated model with a corresponding nominal CAD model. Scanning technologies such as photogrammetry and structured light scanning allow an accurate representation of an article to be obtained, and unique identifiable reference markers, located on or near the article during the scanning process, additionally allow for the recording of data relating to the position and orientation of the article. This data can then be used to ensure precise alignment of the features of the measured article with equivalent features of the nominal CAD model so that an accurate comparison can be made.

For a single bladed disc this alignment and comparison is relatively straightforward. The individual blades are consecutively numbered around the disc or ring for reference and ease of identification of individual blades, with blade one being treated as 'Top Dead Centre' (TDC). All that is required is the correct identification of blade one at the beginning of the scanning procedure to allow the alignment of TDC of the measured component with TDC of the model.

However, the situation is far less straightforward where a number of bladed discs are joined together to form a bladed drum.

Varying requirements of different turbines mean that numerous different combinations of stages are possible, so it is common to model the stages individually rather than modelling complete drum assemblies. This can lead to problems during inspection because there will not be a single TDC for the drum unless blade one for all stages is aligned during manufacture. When the blades are not aligned repeatably and the timing relationships between stages are unknown, it makes inspection and repair or adaptive machining very difficult.

The solution has been to scan each stage individually and compare with its own equivalent model for inspection and machining. However, this approach requires that the drum is repeatedly moved between scanning and machining, requiring multiple set-ups which are time consuming and increase the risk of further damage to the blades.

It would be beneficial, therefore, if the scanning process could be performed for all stages of the assembly before any comparison or adaptive machining were performed.

One solution would be to ensure that all stages on every bladed drum are timed (arranged with blade one of each stage aligned) during assembly. However, certain manufacturing techniques, such as inertial friction welding, make it near impossible to align features, such as turbine blades, between stages of a multi-stage assembly. Inertial friction welding involves rotating two components relative to one another about a common axis to generate heat on their end faces, melting the end faces and then quickly stopping the relative rotation and applying pressure to weld the two drums together. It will be appreciated that any control of rotational alignment of components is extremely difficult to achieve.

Even where alternative approaches, such as Electron Beam Welding, would allow timing of stages, this can still be time consuming and difficult to achieve. Furthermore, in some case an alternative alignment may be preferable for optimum balance and performance of the turbine.

A conflict therefore exists between what is desirable for inspection and repair of components and what is desirable or achievable in their manufacture.

It is an aim of the present invention to overcome or mitigate this conflict.

BRIEF SUMMARY OF THE INVENTION

According to a first aspect of the invention there is provided a method of measuring an assembled component comprising two or more as defined in the appended claim 1. Further advantageous features are recited in the associated dependent claims.

The method comprises the steps of:
1. providing the component with a plurality of unique markers for detection during a scanning process;
2. defining a first of said unique markers and aligning said first defined unique marker with a first element of the component;
3. defining a second of said unique markers and aligning said second defined unique marker with a second element of the component;
4. scanning the component and unique markers to capture a digitised version of the component and the relative positions of the first and second defined unique markers; and
5. aligning a nominal CAD model of a part of the component with the equivalent part of the digitised version of the component using the relative positions of the first and second defined unique markers.

The part of the component may comprise, in particular a bladed disc, or a bladed drum. The bladed disc or bladed drum assembly may be, for example, a compressor disc or drum comprising compressor blades or a turbine disc or drum comprising turbine blades.

By capturing the additional information concerning the relative positions of selected elements of a component, such as the position of blade one on a particular stage of a bladed drum relative to a reference point elsewhere on the component, the present invention allows inspection of components to be performed regardless of the alignment of their different parts. The scanning of a component need be carried out only once, because the additional alignment data can then be used to align one or more CAD models with corresponding parts of the digitised model of the component.

For a bladed drum, this developed process allows measurement of an entire component even when the rotational alignment of stages is unknown. The drum can thus be produced using a preferable manufacturing method, or with individual stages oriented to optimise balance or performance, without fear of preventing or compromising inspection or maintenance of the drum at a later date.

The conflict identified above is thereby avoided.

Additionally, reflective components, such as turbines, typically need to be coated with powder to ensure that scanning with, for example, structured light is reliable. By avoiding the need to perform the scanning operation of each stage of a bladed drum individually, this coating process need only be performed once, rather than before each stage is scanned.

Preferably a third of said unique markers is provided and a third defined unique marker aligned with a third element of the component. The scanning step may then additionally capture the position of the third defined unique marker relative to the first defined unique marker and align a nominal CAD model of a further part of the component with an equivalent part of the digitised version of the component using the relative positions of the first and third defined unique markers. As before, the further part of the component may comprise a bladed disc, in particular a bladed disc, or a bladed drum.

The third set of markers allows two separate nominal CAD models of parts of an assembled component to be independently aligned with a single captured model of the component even when not commonly aligned. For example, on multi-stage bladed drum, models of the first and second stages could be independently aligned with a digitised model of the entire drum even if the alignment or timing between the two stages is unknown. Further defined unique markers may be provided for alignment with further elements as required.

The second and/or third elements may be provided on a circumferential surface of the component, and the first element may be provided on a portion of the assembled component remote from the circumferential surface. The alignment of the second and or third elements (and/or any further elements) may then be rotationally timed with respect to the first element.

The first element of the assembled component may be supplemented with a datum element, for example a pin inserted into an aperture. A visible physical datum, such as a pin or other protrusion, can thus be provided on the assembled component. The alignment of the datum element with a defined unique reference point allows the location of other elements, such as turbine blades, relative to the datum element to be captured so that the reference frames or other unique markers can be removed from the component without losing the information about the relative positions of elements.

The method may further comprise the step of machining part of the component based on a comparison between said part of the digitised version of the component and the aligned nominal CAD model.

The machining step is preferably computer controlled, and the datum element, if provided, may also serve as a locating feature to ensure correct alignment of the component prior to the machining step. The datum element may comprise a pin provided in a hub of the component, for example in the hub face of a bladed drum, and tool paths for the machining operation can then be determined from the reference point of the pin.

The unique markers may be provided on a reference frame which is assembled around and attached to the component so as to avoid permanently marking the component and/or to ensure that parts protruding parts of the component, for example turbine blades, do not obscure the unique markers during the scanning stage.

The reference frame may attached to the component using mounting, hardware which ensures alignment of the defined unique markers with the defined elements of the component. The alignment may be ensured by the provision of pins or tessellating surfaces on the mounting hardware. The powder coating, if required, can then be applied to the component and the mounting hardware ensuring a uniform coverage without risk of obscuring the unique markers on the reference frame.

The reference frame preferably comprises a plurality of discrete parts, and each defined unique marker is provided on a different part of the reference frame. Each defined unique marker can then be individually aligned with a selected element of the component for scanning.

Parts of the reference frame may be supported in discrete sections on a support frame prior to being attached to the component, and each discrete section may be movable towards the component on actuators provided on the support frame. The use of such a support frame to support parts of the reference frame, for example edge parts of the reference frame, minimises the amount of physical contact that is required with the component to be measured. This is particularly beneficial when working with coated components, because the coating can be easily damaged or removed by any physical contact during the set-up process.

The component may be rotated relative to the support frame, or the support frame rotated relative to the component, prior to attachment of each supported part of the reference frame to align the defined unique marker with its respective element of the component. This simplifies the attachment of each part of the support frame in the correct rotational alignment.

The scanning step may comprise two stages, a first stage in which the positions of the defined unique markers are captured, and a second stage in which a plurality of spaced images is captured by the scanning device. The positioning of the scanning device during the second stage may then be optimised using the positions of the defined unique markers captured during the first stage. For example, a first stage of photogrammetry could capture the location of the reference markers in a single scan of an entire multi-stage bladed drum. This information could then be used to determine the best starting position for a structured light scanner for each of the individual stages so that the entire geometry of the component can be captured in as few images as possible.

The two or more parts of the assembled component may each comprise a body of rotation and/or an array of elements about a circumferential surface of each part. Each part may have rotational symmetry.

The invention also provides a method of assessing or repairing an assembled component comprising the method as described above.

The invention allows the use of existing photogrammetry techniques to determine multiple co-ordinate systems on a non-timed aerofoiled component. If a single co-ordinate system were used, each single stage of the component would need to be measured individually, requiring multiple set-ups (increasing the process time) and a complex datuming and alignment technique.

Bladed discs may be formed by machining, investment casting or welding. Welding is often preferred for speed and to minimise material waste, but small amounts of material then need to be removed from the foot of each blade in order to ensure a smooth aerodynamic blend between the aerofoils and the disc rim. The entire bladed disc is additionally commonly subjected to a finishing treatment to ensure a smooth surface finish and to impart compressive strength, which is beneficial to fatigue life.

Where individual bladed discs are joined to form a bladed drum, it would be most efficient to perform any necessary finishing machining and treatments on the final bladed drum rather than on individual bladed discs. The present disclosure theoretically allows all these actions, including the removal of any unwanted material from the friction welding process to be performed after the individual bladed discs have been joined together into a drum.

Wherever practicable, any of the essential or preferable features defined in relation to any one aspect of the invention may be applied to any further aspect. Accordingly the invention may comprise various alternative configurations of the features defined above.

BRIEF DESCRIPTION OF THE DRAWINGS

Practicable embodiments of the invention are described in further detail below by way of example only with reference to the accompanying drawings, of which.

DETAILED DESCRIPTION OF THE INVENTION

Before a component is scanned, a reference frame, with unique markers for detection by the scanning equipment, is assembled around the component. In the following example, the component to be scanned is a bladed drum from the high pressure part of a turbine. Individual single stage bladed discs have been Electron Beam Welded together to form the drum. Although this manufacturing technique allows the stages to be timed, the bladed discs in the example are not timed to illustrate the applicability of the method to untimed assemblies.

The reference frame is itself supported on a support frame which allows individual parts of the reference frame to be attached to the bladed drum in the desired orientations while minimising handling of the drum. It is generally necessary to apply a powdered coating material to highly reflective components, such as metal turbines, to diffuse the light used in the scanning process and ensure an accurate scan is returned. Contact with the component should be minimised once it is coated to avoid removing any part of the coating and compromising the scanning process.

Figure 1:
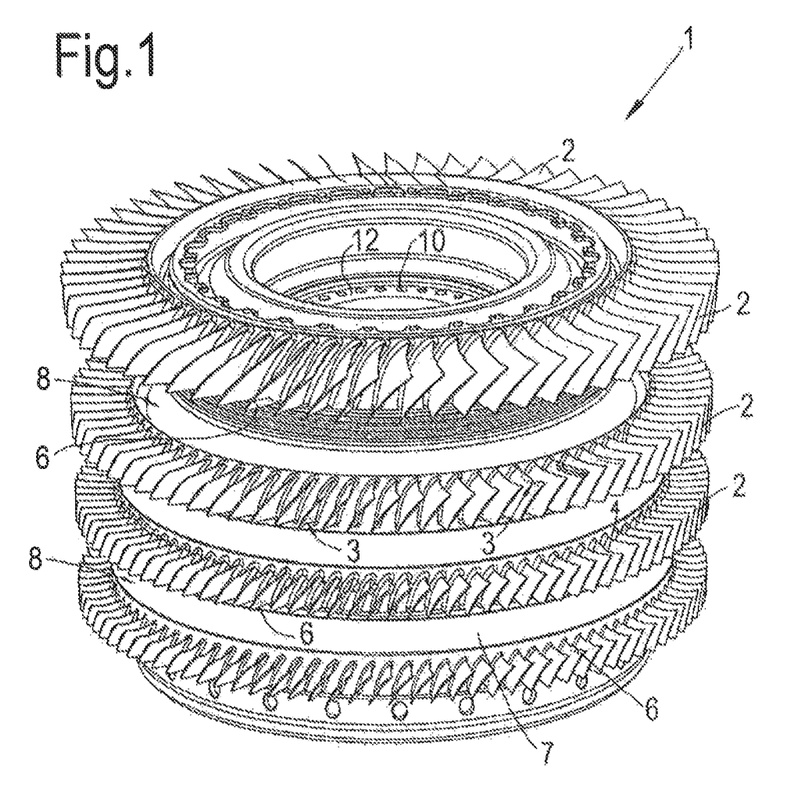
FIG. 1 shows an example of a multi-stage bladed drum.

An example of a four stage bladed drum 1 is shown in FIG. 1. The turbine blades 2 of the four stages vary in size and rotational alignment. Areas of damage 3,4,5,6 are indicated on several of the individual blades 2, FIG. 1 also shows that spaces 8 exist between the adjacent rings of blades 2 on the drum 1. These spaces 8 allow for the positioning of reference frames against the curved sides 7 of the drum 1 without obscuring the individual blades 2. The blades 2 are the components most likely to be damaged during operation, so it is important that the reference frames do not obscure the blades 2 during the scanning process.

A ring of holes 10 is also shown in a hub face 12 towards the top of the drum 1 as illustrated, and the relevance of this to the invention will be explained later.

Figure 2:
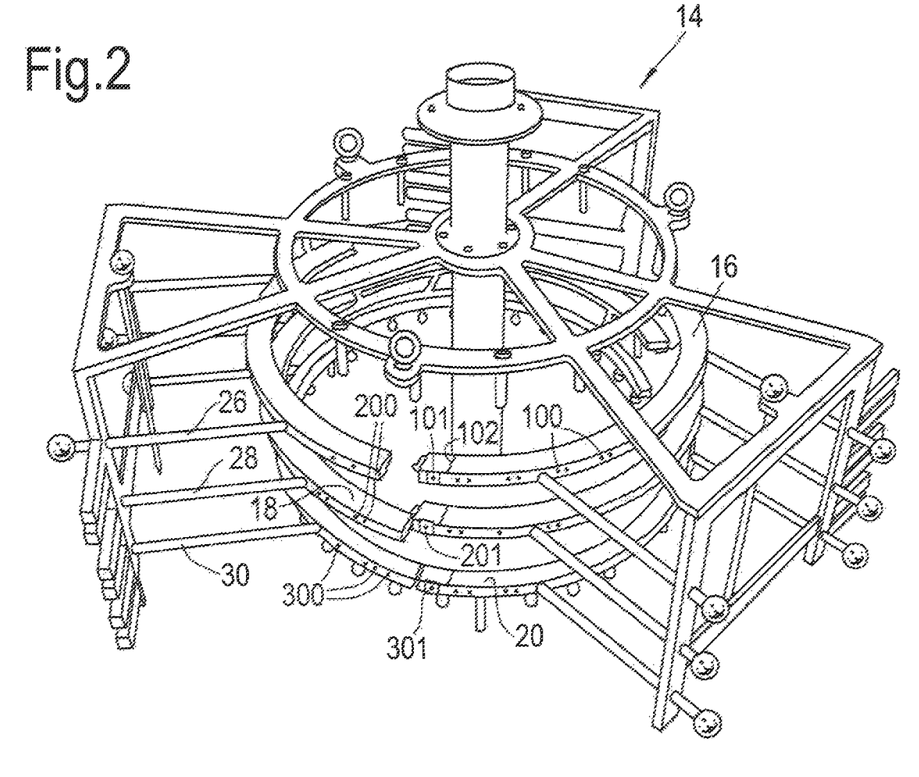
FIG. 2 shows a mounting frame supporting reference frames used in an embodiment of the invention.

The support frame 14 shown in FIG. 2 supports three frame edges 16,18,20, for attachment to the curved sides 7 of a three stage bladed drum. It should be understood that similar frame edges could be provided to accommodate a drum 1 having fewer or more stages, such as shown in FIG. 1.

Each frame edge 16,18,20 is divided into three sections, each of which is supported on sliding rods 26,28,30 extending inwards from the outer edges of the support frame 14. The rods 26,28,30 can slide through the support frame 14 so that the frame edge sections 16,18,20 can be individually moved towards or away from the bladed drum 1 once it is located centrally within the support frame 14.

In use, the sections of the frame edges 16,18,20 are moved outwards by drawing the rods 26,28,30 outwardly through the support frame 14 from the position shown. The support frame 14 is then lowered into position surrounding the bladed drum 1 and appropriately aligned with the first stage. The alignment process will be described in more detail below.

The sections of the frame edge 16 for the first stage are moved into contact with the drum 1 by sliding the related rods 26 through the support frame 14, and are fixed in position. The rods 26 can then be detached, for example unscrewed, from the frame edge sections 16 and withdrawn.

Once the frame edge 16 for the first stage is attached, either the drum 1 or the support frame 14 can be rotated as required to align the next set of frame edge sections 18 with the second stage of the drum 1 and the attachment process repeated. This whole operation can then be repeated again for the third stage (and for any further stages included on the drum 1).

A number of unique identifiable markers 100,200,300 are provided on each frame edge 16,18,20 to provide a number of reference points that will be used in compiling the scan images into a three dimensional model. The use of a collection of unique markers in this way in known when digitising components is known.

However, according to the present invention, one particular marker 101,201,301 on each frame edge 16,18,20 is additionally defined as being representative of the location of blade one of each individual stage of the drum 1. When aligning the reference frame edges 16,18,20 to each stage of the drum 1, these defined markers 101,201,301 are aligned with blade one for each stage as follows.

The final blade of the first stage of the drum 1 is identified by markings on either side of the blade. The first frame edge 16 is provided with a first defined unique marker 101 and a further visible mark 102, such as a line, which a user can easily and precisely align with the trailing edge of the final blade, either visually or with the aid of a timing arm. The further visible mark 102 is spaced from the first defined unique marker 101 such that when it is aligned with a trailing edge of the final blade the centre of the first defined unique marker 101 is properly aligned with blade one. Once aligned, the first frame edge 16 is locked in position.

This process is then repeated for each of the second and third phases, so that second and third defined unique markers 201,301, respectively positioned on second and third frame edges 18,20, are similarly aligned with blade one of the second and third stages.

A final top part 33 of the reference frame (see FIG. 7) is located within the hub and rotated to align a fourth defined unique marker 401, provided on the top part 33 of the reference frame, with a timing pin 32 (see FIG. 4) which has been inserted into one of the holes 10 in the hub face 12 of the drum 1, before being locked into position. The timing pin 32 is preferably located in a hole 10 adjacent blade one of the first stage of the drum 1 so as to minimise the angle between the timing pin 32 and blade one.

With the complete reference frame attached, scanning and digitisation of the bladed drum 1 can begin. In this example, photogrammetry and structured light scanning are used to digitise the bladed drum 1, and the unique markers 100, 200, 300 are fiducial markers appropriate for these processes. However, it should be understood that alternative scanning and digitisation processes familiar to the skilled person could equally be used in the described method, with the exact forms of the unique markers being proprietary to the imaging provider.

The initial photogrammetry process captures the entire bladed drum 1 along with the reference points from the unique markers 100,200,300, and in particular the relative positions of the defined markers 101,201,301,401. Each individual stage is then digitised and measured using structured light scanning. The data from the photogrammetry session is used to ensure that the structured light scanning is optimised for each stage, for example by initially aligning the scanner relative to blade one of each stage so as to minimise the number of steps/images necessary to capture the complex geometry.

This data returned from the digitisation process includes the relative locations of the four defined unique markers 101,201,301,401 and, as a result, the positions of blade one of each stage of the bladed drum 1 relative to the timing pin 32. This information allows for further inspection and maintenance of the bladed drum 1 to be conducted even once the reference frames 16,18,20,33 are removed, by providing precise information of the timing of each stage relative to a single reference point (the timing pin 32) on the drum 1 itself.

The timing pin 32 may also provide a physical keying feature on the drum 1 for use in a subsequent machining step.

The use of reference markers to 'stitch together' successive images captured in a scanning process is known. However, the present invention additionally uses specific preselected markers 101,201,301,401 to also capture and record information about the relative positions of certain parts of the bladed drum 1, or other assembly/component, being scanned. The additional information allows further operations to be carried out on the entire component following just a single setup and measurement operation. This minimises handling and movement of the component, which not only speeds up the process but also reduces the risk of damage to any coating applied to the component, or to the component itself.

The reference frame may be mounted directly on to the component for measuring, but it can be preferable if mounting hardware is attached to the component first. As mentioned above, it is often necessary to apply a powdered coating material to reflective components to ensure a good quality scan. Once the coating is applied, any contact with the component risks removing the coating and compromising the scan. Furthermore, if the coating is likely to obscure the markers on the component if applied before the reference frame is attached, or to obscure the reference points on the reference frame if applied afterwards. By attaching mounting hardware to a bladed drum, or other reflective component, prior to the powder coating phase, these problems can be avoided. The mounting hardware can be aligned using the visible identifiers for the final blade of each stage, and can provide a physical reference feature to ensure correct alignment of the reference frames after the coating is applied.

FIGS. 3 to 8 further illustrate one method according to the claimed invention.

Figure 3:
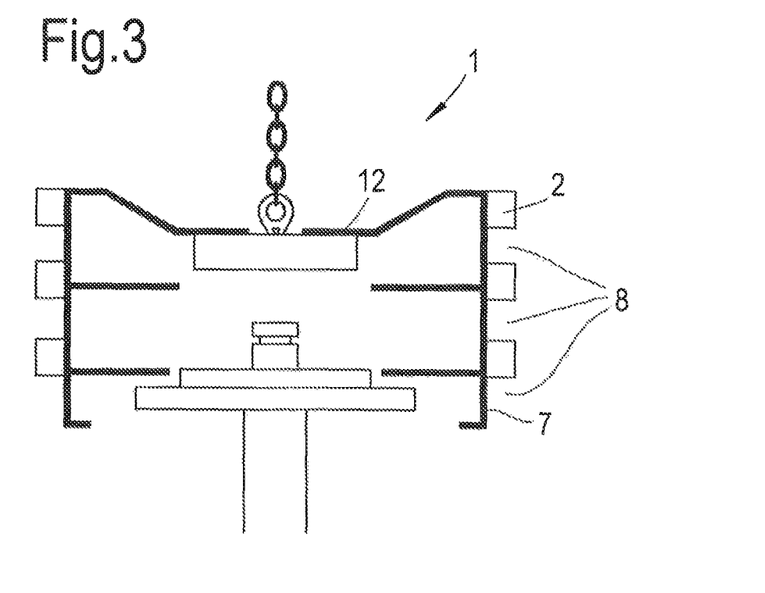
FIG. 3 is a schematic cross-sectional view of a bladed drum ready for measuring in accordance with the invention.

FIG. 3 shows a schematic cross-sectional view of a three stage bladed drum 1 being lowered onto a pedestal. The blades 2 of each stage extend outwardly from the curved side walls 7 of the drum 1 leaving a space 8 between stages one and two, between stages two and three, and below stage three. A hub face 12 is located within the drum 1.

Figure 4:
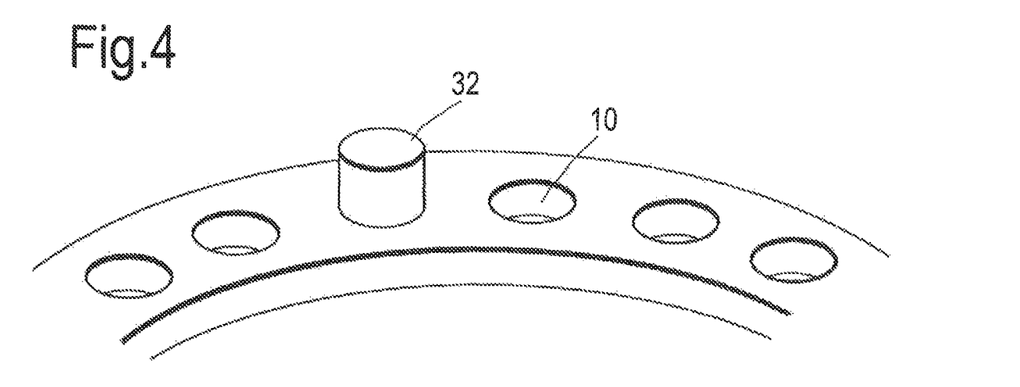
FIG. 4 is a representative view of a part of the top hub of the bladed drum.
Figure 5:
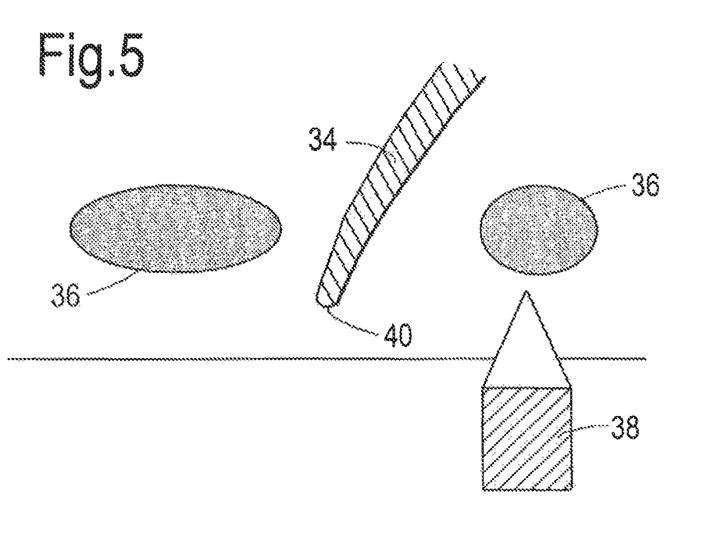
FIG. 5 is a representative view of an individual blade of the bladed drum.

FIG. 4 shows a timing pin 32 located in one of the holes 10 that are provided in the hub face 12, FIG. 5 shows the final blade 34 of one stage of the drum 1 located between its identifying marks 36. A timing arm 38 to assist with location of the trailing edge 40 of the blade 34 is also indicated.

Figure 6:
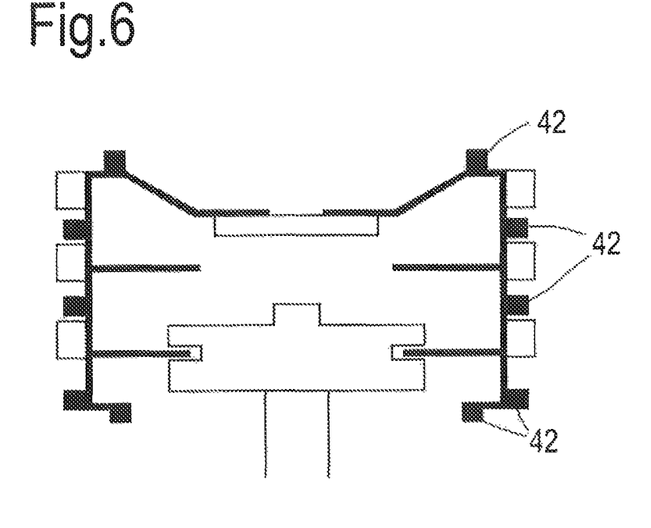
FIG. 6 is a schematic cross-sectional view of the bladed drum with reference frame mounting hardware attached.

FIG. 6 is a further schematic cross-section, similar to FIG. 3, showing the drum 1 with reference frame mounting hardware 42 attached in the spaces 8 between and below the three stages of the drum 1. The mounting hardware 42 can be aligned and attached to the drum 1 as described above for the reference frame and includes pins or other engagement features to ensure correct alignment of the various parts 16,18,20,33 of reference frame. The mounting hardware 42 may be either be provided as full rings, or as a number of discrete components to provide separate mounting points for the reference frame.

Once the mounting hardware 42 is attached, the entire assembly of the drum 1 and the mounting hardware 42 is sprayed or otherwise coated with powder to avoid problems associated with the reflective surface of the drum 1, before being transferred to a rotary table for the scanning process.

Figure 7:
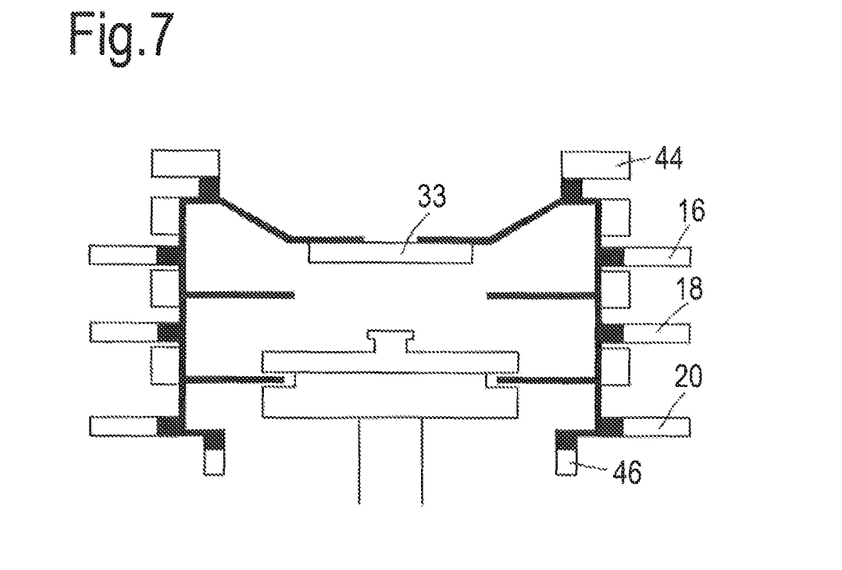
FIG. 7 is a schematic cross-sectional view of the bladed drum with reference frames attached to the mounting hardware.

FIG. 7 shows a schematic cross-sectional view of the drum 1 ready for scanning/digitisation. Reference frames edges 16,18,20, and a top part 33, have been attached to the mounting hardware 42. Two additional reference frames 44,46 are shown beyond the four previously described. The additional reference frames 44,46 may be beneficial in providing additional reference points to compile the image of the drum 1 from the scanning process, but they need not be aligned with any particular part of the drum 1.

Figure 8:
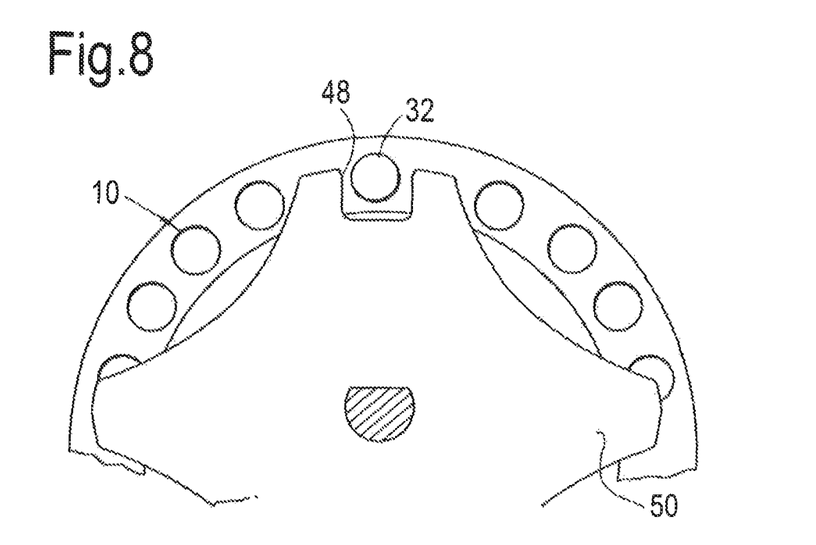
FIG. 8 is a representative view of a top hub face of the bladed drum when the drum is ready for machining.

The location of blade one for each stage is captured during the digitisation process by virtue of the alignment of the defined markers 101,201,301, which are identified in the system as indicating blade one. The location of the timing pin 32 is similarly captured by virtue of aligned marker 401. The resulting information allows subsequent operations to be conducted relative to the timing pin 32. For example, machining operations would use a coordinate system based on the location of the timing pin 32, with all tool paths for machining the component relative to the timing pin 32 and the hub face 12 of the drum 1. The timing pin 32 may itself be used to locate the drum 1 appropriately during the machining operation, for example by being received in a slot 48 provided in the machining fixture 50, as indicated in FIG. 8.

The concept enables each untimed bladed disc making up the drum to have a relative local co-ordinate system created relative to the hub face, so that the CAD models of each individual bladed disc can be precisely aligned with the relevant stage of the drum as scanned. Having these relative and parametric co-ordinate systems enables inspection and adaptive machining processes to take place using a simple primitive alignment procedure. The blades on each stage can then be adaptively (individually and on a case by case bases) inspected or machined vs a nominal and ideal blade.

Figure 9:
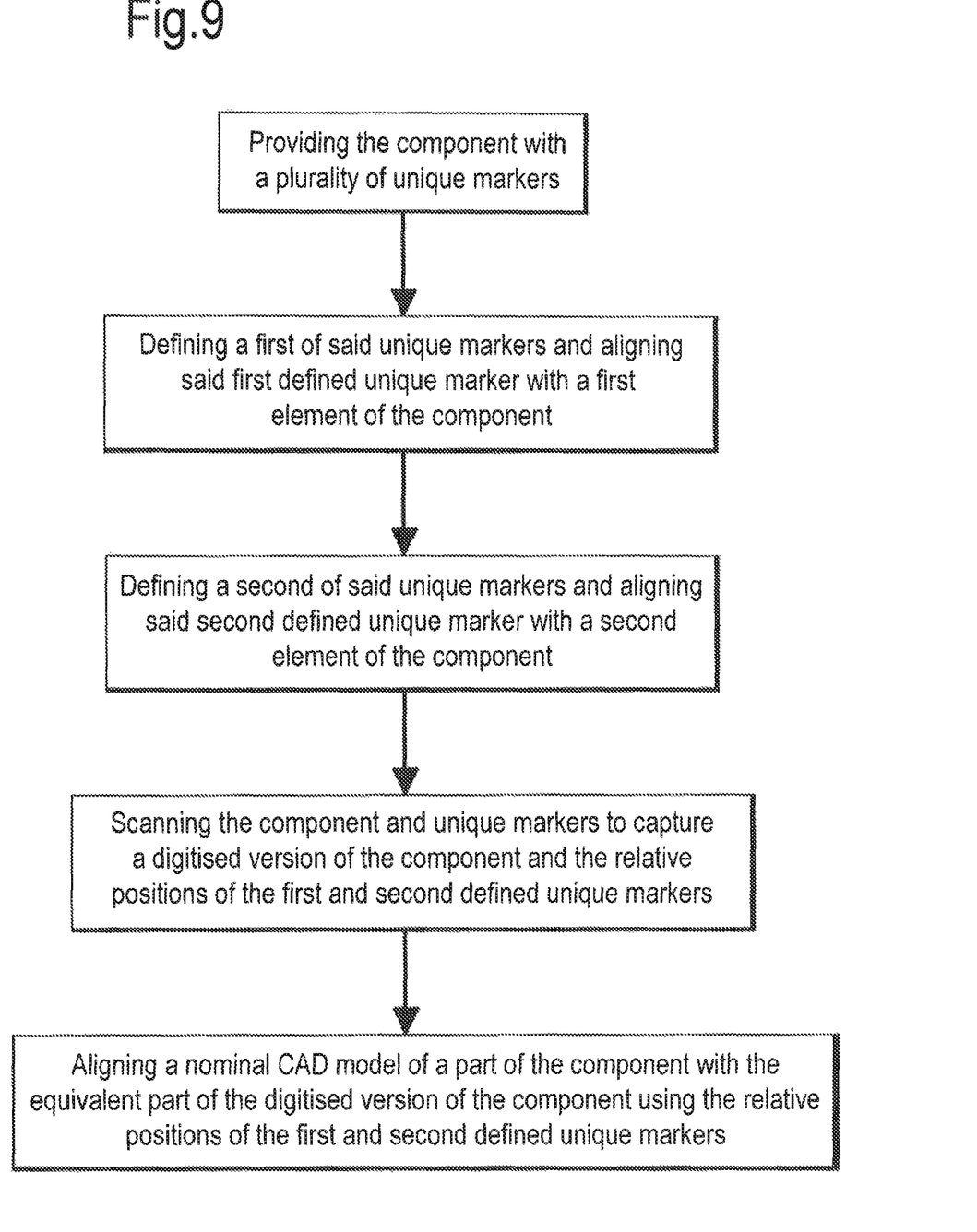
FIG. 9 shows a process according to various examples.

FIG. 9 shows a process according to various examples.

This process is described above with reference to inspecting a multistage drum formed of individual bladed discs. However, it could be used to measure and inspect any Multi-staged bladed assembly eg civil, defence, marine or steam gas turbine engines. It is especially relevant where timing of individual stages is deemed either non-value added or impossible ie for an assembly that has inertia welded components, but would equally work with other timed or untimed components. Indeed, the process would be beneficial in the measurement of any assembly where two or more components are assembled along a centreline.

The same referencing principle is could also be used in other Cartesian geometry based systems such as Computer Tomography or X-ray, as a way to identify features relative to local co-ordinate systems.

The invention claimed is:

1. A method of measuring an assembled component comprising two or more parts, the method comprising the steps of:
providing the component with a plurality of unique markers for detection during a scanning process;
defining a first of said unique markers and aligning said first defined unique marker with a first element of the component, wherein the first element is provided on a portion of the assembled component remote from a circumferential surface of the component;
defining a second of said unique markers and aligning said second defined unique marker with a second element of the component, wherein the second element is provided on the circumferential surface of the component;
scanning the component and unique markers to capture a digitized version of the component and the relative positions of the first and second defined unique markers; aligning a nominal CAD model of a first stage of a part of the component and aligning a nominal CAD model of a second stage of the part of the component with the equivalent part of the digitized version of the component using the relative positions of the first and second defined unique markers,
wherein the part of the component is a multi-stage bladed drum, the first stage and the second stage being stages of the multi-stage bladed drum, the first and second stages being individually and independently aligned; and
machining the part of the component based on a comparison between the part of the digitized version of the component and the aligned nominal CAD model.

2. The method according to claim 1, further comprising the step of:
defining a third of said unique markers and aligning said third defined unique marker with a third element of the component;
wherein the scanning step additionally captures the position of the third defined unique marker relative to the first defined unique marker; and,
aligning a nominal CAD model of a further part of the component with an equivalent part of the digitized version of the component using the relative positions of the first and third defined unique markers.

3. The method according to claim 2, wherein the third element is provided on a circumferential surface of the component and the first element is provided on a portion of the assembled component remote from the circumferential surface.

4. The method according to claim 3, further comprising the step of supplementing the first element with a datum element.

5. The method according to claim 4, wherein the first element comprises an aperture provided in the component and the datum element comprises a pin inserted into the aperture.

6. The method according to claim 1, wherein the machining step is computer controlled, and wherein the datum element provides a locating feature to ensure correct alignment of the component prior to the machining step.

7. The method according to claim 1 wherein said unique markers are provided on a reference frame which is assembled around and attached to the component.

8. The method according to claim 7 wherein said reference frame is attached to the component using mounting hardware which ensures alignment of the defined unique markers with the defined elements of the component.

9. The method according to claim 7 wherein said reference frame comprises a plurality of discrete parts, and wherein each defined unique marker is provided on a different part of the reference frame.

10. The method according to claim 9, wherein parts of the reference frame are supported in discrete sections on a support frame prior to being attached to the component, and wherein each discrete section is movable towards the component on actuators provided on the support frame.

11. The method according to claim 10, wherein the component is rotated relative to the support frame prior to attachment of each supported part of the reference frame to align the defined unique marker with its respective element of the component.

12. The method according to claim 10, wherein the support frame is rotated relative to the component prior to attachment of each supported part of the reference frame to align the defined unique marker with its respective element of the component.

13. The method according to claim 1, wherein the scanning step comprises a first step, in which the positions of the defined unique markers are captured, and a second step in which a plurality of spaced images is captured by the scanning device, and wherein the positioning of the scanning device during the second step is optimized using the positions of the defined unique markers captured during the first step.

14. The method according to claim 1, wherein the two or more parts of the assembled component each comprise a body of rotation and/or an array of elements about a circumferential surface of each part, wherein each part may have rotational symmetry.

\* \* \* \* \*